(12) United States Patent
Park

(10) Patent No.: US 9,905,304 B2
(45) Date of Patent: Feb. 27, 2018

(54) MEMORY SYSTEM AND PROGRAM OPERATION METHOD BASED ON PROGRAM SPEED INFORMATION

(71) Applicant: SK hynix Inc., Icheon-si, Gyeonggi-do (KR)

(72) Inventor: Eun Young Park, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/000,481

(22) Filed: Jan. 19, 2016

(65) Prior Publication Data

US 2017/0069384 A1    Mar. 9, 2017

(30) Foreign Application Priority Data

Sep. 3, 2015 (KR) .......................... 10-2015-0125042

(51) Int. Cl.
| | | |
|---|---|---|
| *G11C 15/00* | (2006.01) | |
| *G11C 16/32* | (2006.01) | |
| *G11C 16/10* | (2006.01) | |
| *G11C 16/04* | (2006.01) | |

(52) U.S. Cl.
CPC .............. *G11C 16/32* (2013.01); *G11C 16/10* (2013.01); *G11C 15/00* (2013.01); *G11C 16/0483* (2013.01); *G11C 2211/5646* (2013.01)

(58) Field of Classification Search
CPC .............................. G11C 15/046; G11C 17/00
See application file for complete search history.

(56) References Cited

U.S. PATENT DOCUMENTS

| | | | | |
|---|---|---|---|---|
| 2009/0086545 A1* | 4/2009 | Lee | .................. | G11C 16/349 365/185.19 |
| 2011/0161565 A1* | 6/2011 | Chua | .................. | G06F 12/0246 711/103 |
| 2015/0070987 A1* | 3/2015 | Kim | .................. | G11C 16/12 365/185.03 |

FOREIGN PATENT DOCUMENTS

| | | |
|---|---|---|
| KR | 1020110131648 A | 12/2011 |
| KR | 1020140024723 A | 3/2014 |

* cited by examiner

*Primary Examiner* — Mohammed A Bashar
(74) *Attorney, Agent, or Firm* — William Park & Associates Ltd.

(57) ABSTRACT

There are provided a memory system having improved reliability and an operating method thereof. A memory system includes a semiconductor memory device including a memory cell array having a plurality of pages, and a controller for sequentially transmitting, to the semiconductor memory device, physical block addresses of pages to be programmed among the plurality of pages. In the memory system, the semiconductor memory device selects a page corresponding to each of the physical block addresses among the plurality of pages according to previously stored program speed information, and performs a program operation on the selected page.

20 Claims, 8 Drawing Sheets

FIG. 6A

| PBA# | WL(PAGE)# |
|------|-----------|
| 1    | 1         |
| 2    | 2         |
| ⋮    | ⋮         |
| N-1  | N-1       |
| N    | N         |

<default>

FIG. 6B

| PBA# | WL(PAGE)# |
|------|-----------|
| 1    | N-3       |
| 2    | N         |
| 3    | 9         |
| 4    | 5         |
| ⋮    | ⋮         |
| N-1  |           |
| N    |           |

<AFTER LOADING PROGRAM SPEED INFORMATION>

MEMORY SYSTEM AND PROGRAM OPERATION METHOD BASED ON PROGRAM SPEED INFORMATION

CROSS-REFERENCE TO RELATED APPLICATION

The present application claims priority to Korean patent application number 10-2015-0125042 filed on Sep. 3, 2015, in the Korean Intellectual Property Office, the entire disclosure of which is herein incorporated by reference in its entirety.

BACKGROUND

1. Field of the Invention

An aspect of the present disclosure relates to an electronic device, and more particularly, to a memory system and an operating method thereof.

2. Description of the Related Art

A semiconductor memory device is a memory device implemented using a semiconductor comprised of, for example, silicon (Si), germanium (Ge), gallium arsenide (GaAs), or indium phosphide (InP). The semiconductor memory device is generally classified into a volatile memory device and a nonvolatile memory device.

The volatile memory is a memory device which loses stored data when power supply is cut off. Examples of volatile memory devices include a static random access memory (SRAM), a dynamic RAM (DRAM), a synchronous DRAM (SDRAM), and the like. The nonvolatile memory is a memory device which retains stored data even when a power supply is cut off. Examples of nonvolatile memory devices include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memory is generally classified into NOR type flash memory and NAND type flash memory.

SUMMARY

Embodiments provide a memory system having improved reliability and an operating method thereof.

According to an aspect of the present disclosure, there is provided a memory system including a semiconductor memory device configured to include a memory cell array having a plurality of pages; and a controller configured to sequentially transmit, to the semiconductor memory device, physical block addresses of pages to be programmed among the plurality of pages, wherein the semiconductor memory device selects a page corresponding to each of the physical block addresses among the plurality of pages according to previously stored program speed information, and performs a program operation on the selected page.

Previously set pages among the plurality of pages may be defined as a CAM area, and the program speed information may be stored in the CAM area.

The program speed information may be information in which the physical block addresses are sequentially mapped to the plurality of pages from a page having the slowest program speed.

According to an aspect of the present disclosure, there is provided a method of operating a memory system which includes a semiconductor memory device including a memory cell array having a plurality of pages and a controller for controlling the semiconductor memory device. The method includes loading program speed information stored in a CAM area of the memory cell array if power is supplied to the memory system; determining a word line corresponding to a physical block address of a page to be programmed among the plurality of pages, based on the program speed information; and performing a program operation on the determined word line.

According to an aspect of the present disclosure, there is provided a method of operating a memory system including a memory cell array having a plurality of pages. The method includes loading program speed information stored in a CAM area of the memory cell array if power is supplied to the memory system; determining a program order of the plurality of pages, based on the program speed information; and performing a program operation on each of the plurality of pages according to the determined program order.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough, and will fully convey a scope of example embodiments to those skilled in the art.

In the drawing figures, dimensions may be exaggerated for clarity of illustration. It will be understood that when an element is referred to as being "between" two elements, the element may be the only element between the two elements, or one or more intervening elements may also be present. Like reference numerals refer to like elements throughout.

FIGS. 6A and 6B are diagrams illustrating examples of performing a program operation on memory according to an embodiment of the present disclosure.

DETAILED DESCRIPTION

Figure 1:
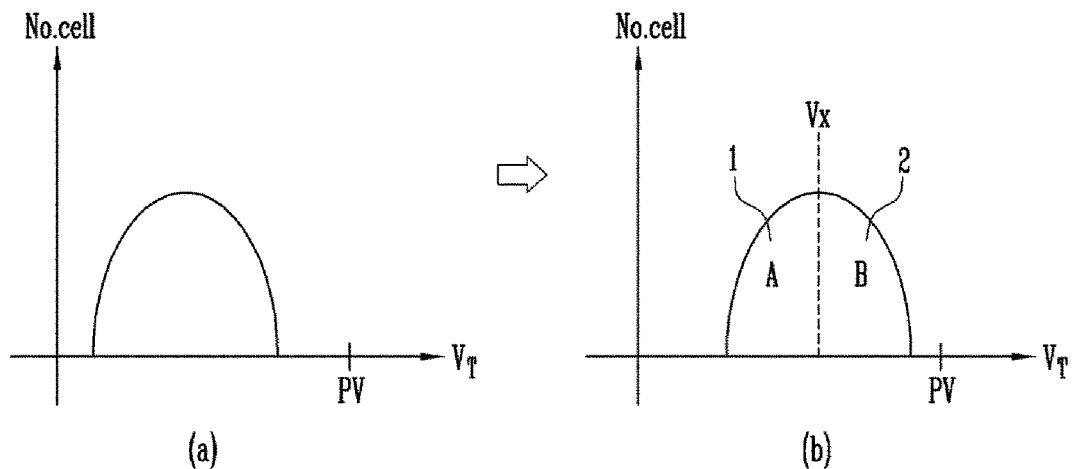
FIG. 1 is a diagram illustrating program speeds of memory cells according to an embodiment of the present disclosure.

Specific structural or functional descriptions of exemplary embodiments in accordance with a concept of the present disclosure which are disclosed in this specification are illustrated only to describe the exemplary embodiments in accordance with a concept of the present disclosure and the exemplary embodiments in accordance with a concept of the present disclosure may be carried out by various forms but the present disclosure is not limited to the exemplary embodiments described in this specification.

Various modifications and changes may be applied to the exemplary embodiments in accordance with a concept of the present disclosure so that the exemplary embodiments will be illustrated in the drawings and described in detail in the specification. However, the exemplary embodiments according to a concept of the present disclosure is not limited to the specific embodiments, but includes all changes, equivalents, or alternatives which are included in the spirit and technical scope of the present disclosure.

Terminologies such as first or second may be used to describe various components but the components are not limited by the above terminologies. The above terminologies are used to distinguish one component from an other component, for example, a first component may be referred to as a second component without departing from a scope in accordance with a concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between," or "adjacent to" and "directly adjacent to" need to be interpreted in the same manner.

Terminologies used in the present specification are used only to describe specific exemplary embodiments and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those described in the specification is present, but do not exclude the possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if the terms are not clearly defined in this specification.

Technical descriptions that are well known in the art to which the present disclosure pertains and are not directly connected with the present disclosure will be omitted as much as possible from the descriptions of the embodiments. This is for the purpose of communicating features of the present disclosure more clearly by omitting unnecessary descriptions.

Hereinafter, the present disclosure will be described in detail by explaining exemplary embodiments of the present disclosure with reference to the accompanying drawings.

FIG. 1 is a diagram illustrating a method of determining a program speed of memory cells.

State (a) of FIG. 1 shows a distribution of threshold voltages of the memory cells in a state in which data of the memory cells are erased. State (b) of FIG. 1 shows a distribution of threshold voltages of the memory cells after a program pulse is applied.

A program operation is performed by applying a program pulse such that threshold voltages of the memory cells are greater than or equal to a program target voltage PV. Since a plurality of memory cells are connected to one word line, the memory cells of the word line can be divided into memory cells to be programmed and memory cells which are not to be programmed. To this end, when a program operation is performed, a program permission voltage may be applied to bit lines connected to selected memory cells and a program prohibition voltage may be applied to bit lines connected to unselected memory cells. The program permission voltage may have a level of 0V, and the program prohibition voltage may be a positive voltage (e.g., a power voltage).

If a program pulse is applied according to the distribution of the state (a) of FIG. 1, the threshold voltages of the memory cells may be changed into state (b). In this case, if a program verify voltage Vx is applied, cells having threshold voltages equal to or smaller than the verify voltage may be slow cells, and cells having threshold voltages equal to or greater than the verify voltage may be fast cells. This happens because the memory cells may have different program operation speeds due to differences in their electrical characteristics. That is, cells having operation speeds relatively faster than those of other cells are referred fast cells, and cells having operation speeds relatively slower than those of other cells are referred to as slow cells. Fast cells and slow cells may be connected to a selected word line. Although the same program pulse is applied to the fast cells and the slow cells, a program operation of the fast cells may be completed before slow cells.

Whether a cell is fast or slow may be determined in page units. Specifically, a fast page or a slow page may be determined based on an order in which the program operation of memory cells connected to each word line associated with a particular page is completed. Alternatively, a fast page or a slow page may be determined based on a ratio of memory cells in which a program operation of memory cells connected to the word line associated with a particular page is completed. In still another embodiment, relative program speeds of pages may be determined by using differences in a program speed between memory cells connected to a word line.

The present disclosure proposes a memory system which measures a program speed of memory cells of each page in a memory cell array, and performs a program operation by changing an order of pages to be programmed according to the measured program speeds to prevent a disturbance phenomenon. In the case of memory cells, the distribution of threshold voltages of memory cells connected to a last word line may be out of a target range. On the other hand, in the case of 3D memory cells, a change in distribution of threshold voltages depending on a program order is slight. Hence, although the order of pages to be programmed is changed, the distribution of threshold voltages is hardly widened. Thus, in order to improve the reliability of the memory system, the program operation of slow cells is first performed, thereby optimizing the distribution of threshold voltages.

Figure 2:
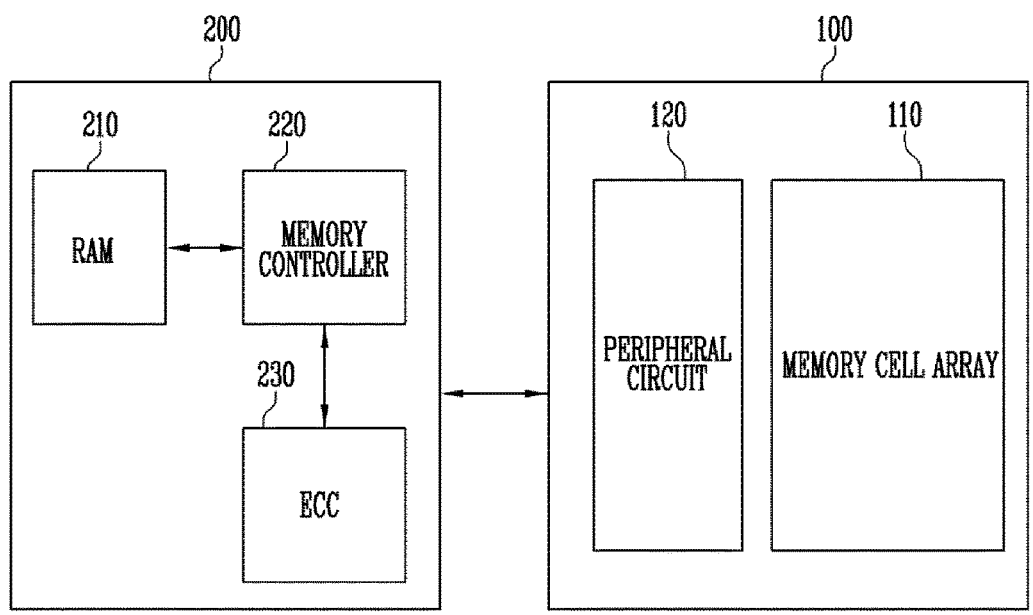
FIG. 2 is a block diagram illustrating a configuration of a memory system according to an embodiment of the present disclosure.

FIG. 2 is a block diagram illustrating a configuration of a memory system according to an embodiment of the present disclosure.

The memory system 50 includes a semiconductor memory device 100 and a controller 200.

The semiconductor memory device 100 may be a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. Also, the semiconductor memory device 100 of the present disclosure may be implemented in a three-dimensional array structure. The present disclosure may be applicable to a flash memory device in which a charge storage layer is formed by a conductive floating gate (FG), but also to a charge trap flash (CTF) memory in which a charge storage layer is formed of an insulation film.

The semiconductor memory device 100 may be configured to include a memory cell array 110 and a peripheral circuit 120 for driving the memory cell array 110. The memory cell array 110 may include a plurality of pages including a plurality of nonvolatile memory cells.

The memory cell array 110 further includes a plurality of memory blocks, and the plurality of memory blocks may be divided into system blocks, user blocks, and the like according to their uses.

The peripheral circuit 120 operates in response to the controller 200. The peripheral circuit 120 may program data in the memory cell array 110 in response to the controller 200. The peripheral circuit 120 may operate to read data from the memory cell array 110 and erase data of the memory cell array 110.

In various embodiments, read and program operations of the semiconductor memory device 100 may be performed in page units. An erase operation of the semiconductor memory device 100 may be performed in block units.

When a program operation is performed, the peripheral circuit 120 may receive, from the controller 200, a command indicating the program operation, a physical block address PBA (physical address, PA) of pages to be programmed, and write data. If one memory block and one page included in the corresponding memory block are selected by the physical block address PBA, the peripheral circuit 120 may program write data in the selected page.

When a read operation is performed, the peripheral circuit 120 may receive, from the controller 200, a command indicating a read operation (hereinafter, referred to as a read command) and a physical block address PBA. The peripheral circuit 120 may read data from one memory block and one page included therein, which are selected by the physical block address PBA, and the peripheral circuit 120 may output the read data (hereinafter, referred to as page data) to the controller 200.

When an erase operation is performed, the peripheral circuit 120 may receive, from the controller 200, a command indicating the erase operation and a physical block address PBA. The physical block address PBA may specify one memory block of the memory cell array 110. The peripheral circuit 120 may erase data of a memory block corresponding to the physical block address PBA.

The controller 200 controls overall operations of the semiconductor memory device 100. The controller 200 may access the semiconductor memory device 100 in response to a request from an external host.

The controller 200 may include a random access memory (RAM) 210, a memory controller 220, and an error correction circuit (ECC) 230.

The RAM 210 operates in response to control of the memory controller 220, and the RAM 210 may be used as a work memory, a buffer memory, a cache memory, or the like. When the RAM 210 is used as work memory, the RAM 210 may arbitrarily store data processed by the memory controller 220. When the RAM 210 is used as buffer memory, the RAM 210 may be used to buffer data to be transmitted from a host (not shown) to the semiconductor memory device 100 or from the semiconductor memory device 100 to the host (not shown).

The memory controller 220 is configured to control read, program, erase, and background operations of the semiconductor memory device 100. The memory controller 220 is configured to drive firmware for controlling the semiconductor memory device 100.

The memory controller 220 may translate a logical block address LBA to a physical block address PBA through a flash translation layer (FTL), where the logical block address LBA may be provided from the host. Specifically, the FTL may use a mapping table to receive a logical block address LBA, and translate the received logical block address LBA to a physical block address PBA. The physical block address PBA may be a page number specifying a specific word line of the memory cell array 110. There are various address mapping methods of the FTL according to mapping units. Representative address mapping methods include a page mapping method, a block mapping method, and a hybrid mapping method.

In the present disclosure, when the controller 200 translates a host provided logical block address LBA to a physical block address PBA, a program order of pages of the memory cell array 110 may be determined by reflecting program speed information. The memory controller 220 may translate a logical block address LBA to a physical block address PBA by using a mapping table which reflects program speeds. The memory controller 220 may provide the semiconductor memory device 100 with the translated physical block address PBA together with a program command.

Specifically, if power is supplied to the memory system 50 (power-on), the memory controller 220 may load program speed information into RAM 210. The program speed information may be stored in a CAM area 126 (see FIG. 3) of the memory cell array 110. The program speed information may be information in which program speeds of the plurality of memory cells included in the memory cell array are listed for each page.

The memory controller 220 may translate a logical block address LBA provided from the host to a physical block address PBA by reflecting program speed information loaded into the RAM 210. The program speed information may be information in which word lines are listed in an order of slow pages. In other words, word lines may be maintained or listed from word lines associated with the slowest page, with each page having an increasing speed, to word lines associated the fastest page. In one example, the program speed information may be based on the program speed information for each page.

The loaded program speed information is continuously stored in the RAM 210 as long as power is maintained, and may not require separate execution whenever a command is input.

The ECC 230 generates parity as an error correction code for data to be programmed. When a read operation is performed, the ECC 230 may correct an error of read page data by using parity. The ECC 230 may correct an error by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, Hamming code, etc.

When a read operation is performed, the ECC 230 may correct an error of read page data. When error bits exceeding a correctable bit number are included in the read page data, decoding may fail. Decoding is successful when error bits equal to or smaller than the correctable bit number are included in the read page data.

Success in the decoding represents that a corresponding read command passed. Failure in the decoding represents that the corresponding read command failed. When the decoding succeeds, the controller 200 outputs, to the host, page data of which error has been corrected.

Figure 3:
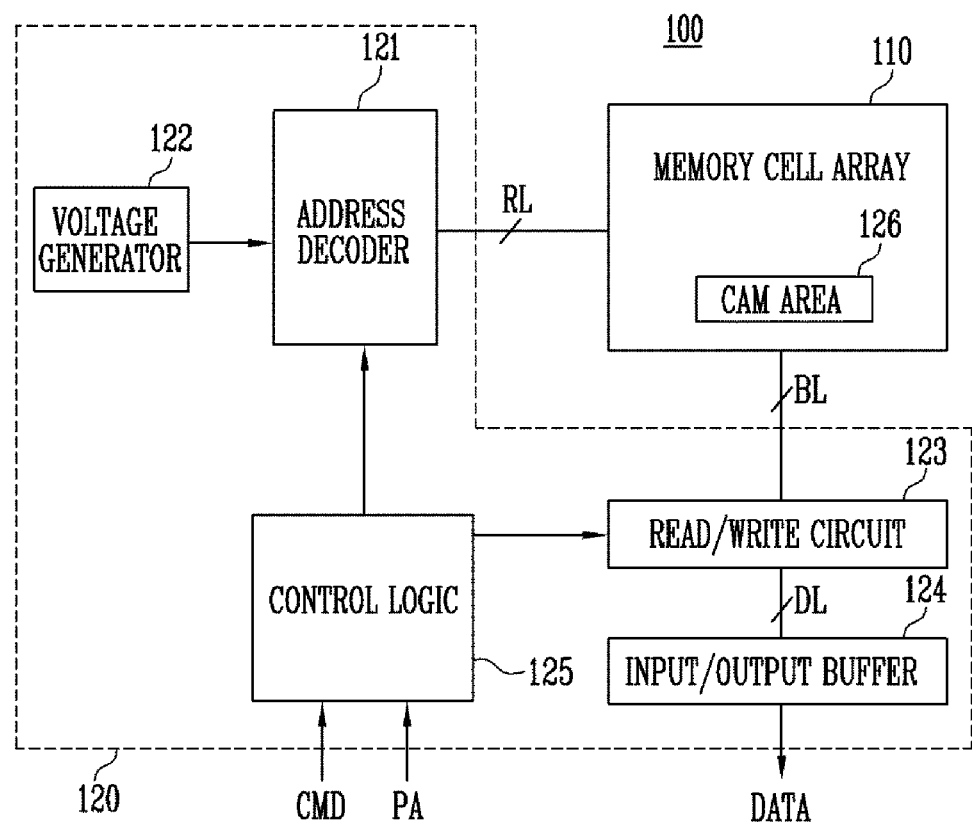
FIG. 3 is a block diagram illustrating a structure of a semiconductor memory device according to an embodiment of the present disclosure.

FIG. 3 is a block diagram illustrating a structure of a semiconductor memory device according to an embodiment of the present disclosure.

Referring to FIG. 3, the semiconductor memory device 100 includes the memory cell array 110 and the peripheral circuit 120.

The memory cell array 110 includes a plurality of memory cells. The plurality of memory cells are connected to an address decoder 121 through row lines RL, and connected to a read/write circuit 123 through bit lines BL.

The plurality of memory cells included in the memory cell array 110 may be divided into a plurality of blocks according to their uses. Here, the plurality of blocks may be divided into a main block and an extra block. Setting information associated with operations of the memory cells may be stored in the extra block. Specifically, the extra block may include a CAM area 126. In the present disclosure, information on program speeds of pages constituting the memory cell array 110 may be stored in the CAM area 126. The CAM area 126 includes various setting information required to perform an operation of the memory system, such as a read level, a program level, and various offset information.

If power is supplied to the memory system 50 (power-on), the memory system 50 performs a reset operation for the purpose of initialization. When the reset operation is first performed, the memory system 50 performs an auto CAM read operation. In this case, setting information stored in the CAM area 126 may be loaded into an internal RAM included in the semiconductor memory device 100, to be used in an operation of the semiconductor memory device 100.

The peripheral circuit 120 includes the address decoder 121, a voltage generator 122, the read/write circuit 123, an input/output buffer 124, and control logic 125.

The address decoder 121 is connected to the memory cell 110 through the row lines RL. The address decoder 121 is configured to operate in response to control of the control logic 125. The address decoder 121 receives a physical block address PBA through the control logic 125.

A program operation of the semiconductor memory device 100 is performed in page units. A physical block address PBA received in the program operation includes at least one of a block address and row address.

The address decoder 121 is configured to decode the block address in the received physical block address PBA. The address decoder 121 selects one memory block among a plurality of memory blocks BLK1 to BLKz according to the decoded block address.

The address decoder 121 is configured to select one word line in a selected memory block by decoding the row address in the received physical block address PBA. Accordingly, one page is selected. The one word line selected by the address decoder 121 is set to correspond to the physical block address PBA.

The voltage generator 122 operates in response to control of the control logic 125. The voltage generator 122 generates an internal power voltage by using an external power voltage supplied to the semiconductor memory device 100. For example, the voltage generator 122 generates the internal power voltage by regulating the external power voltage. The generated internal power voltage is provided to the address decoder 121, the read/write circuit 123, the input/output buffer 124, and the control logic 125, to be used as an operation voltage of the semiconductor memory device 100.

The voltage generator 122 generates a plurality of voltages by using at least one of the external power voltage and the internal power voltage. In an embodiment, the voltage generator 122 includes a plurality of pumping capacitors for receiving the internal power voltage, and generates a plurality of voltages by selectively activating a plurality of pumping capacitors in response to control of the control logic 125. For example, when a read operation is performed, the voltage generator 122 generates a read voltage and a pass voltage, where the pass voltage has a higher level than the read voltage. The generated voltages may be provided to the address decoder 121.

The control logic 125 is configured to control overall operations of the semiconductor memory device 100. The control logic 125 may receive a command CMD and a physical block address PBA. When a read operation is performed, the command CMD may be a command indicating the read operation. When a program operation is performed, the command CMD may be a command indicating the program operation. When an erase operation is performed, the command CMD may be a command indicating the erase operation. The control logic 125 is configured to control the address decoder 121, the voltage generator 122, the read/write circuit 123, and the input/output buffer 124 in response to the received command CMD.

The read/write circuit 123 is connected to the memory cell array 110 through the bit lines BL. The read/write circuit 123 operates in response to control of the control logic 125.

The input/output buffer 124 is connected to the read/write circuit 123 through a data line DL. The input/output buffer 124 operates in response to control of the control logic 125. The input/output buffer 124 outputs page data DATA to the controller 200 (see FIG. 2). The page data DATA may be transmitted through the data lines from the read/write circuit 123.

Figure 4:
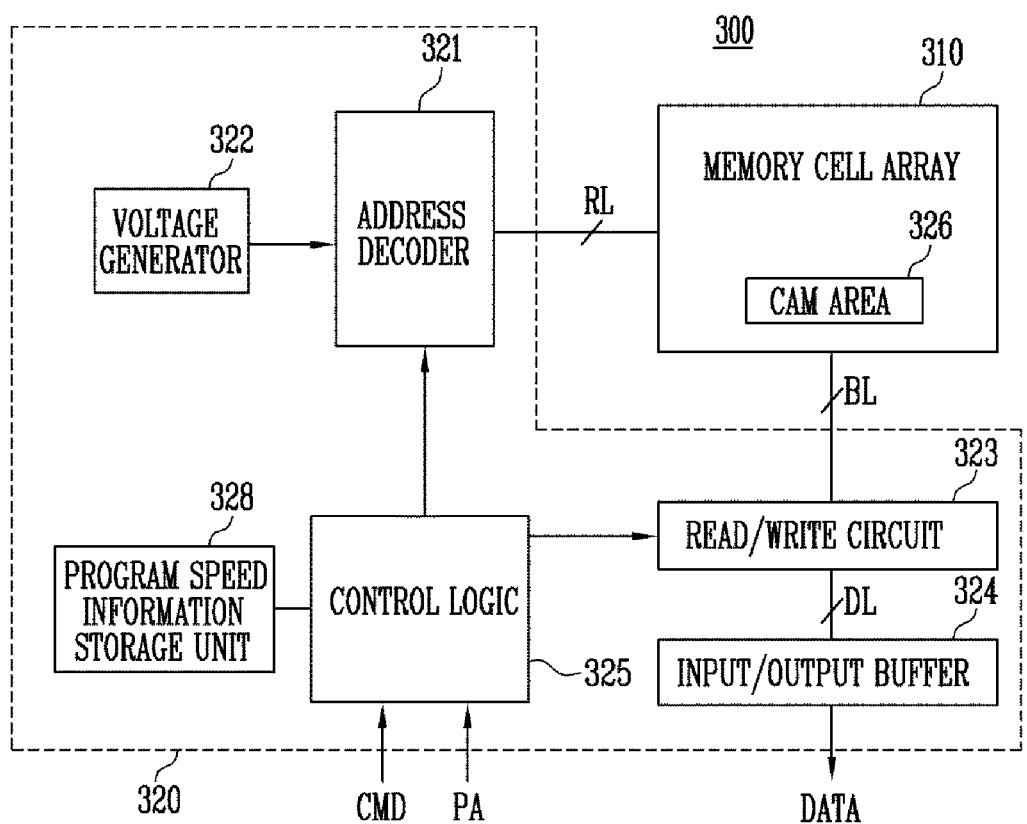
FIG. 4 is a block diagram illustrating a structure of a semiconductor memory device according to another embodiment of the present disclosure.

FIG. 4 is a block diagram illustrating a structure of a semiconductor memory device according to another embodiment of the present disclosure.

Referring to FIG. 4, the semiconductor memory device 300 may include a memory cell array 310 and a peripheral circuit 320.

The memory cell array 310 includes a plurality of memory cells. The plurality of memory cells are connected to an address decoder 321 through row lines RL, and connected to a read/write circuit 323 through bit lines BL.

The peripheral circuit 320 includes the address decoder 321, a voltage generator 322, the read/write circuit 323, an input/output buffer 324, and a control logic 325.

In FIG. 4, the address decoder 321, the voltage generator 322, the read/write circuit 323, the input/output buffer 324, and the control logic 325 may correspond to the address decoder 121, the voltage generator 122, the read/write circuit 123, the input/output buffer 124, and the control logic 125 of FIG. 3, respectively. Here, the control logic 325 and a program speed storage information unit 328, which are different from the embodiment of FIG. 3, will be described in detail, and descriptions of the other components are described in FIG. 3.

If power is supplied to the memory system 50 of the present disclosure (power-on), the control logic 325 may retrieve program speed information stored in a CAM area 326 among the plurality of pages of the memory cell array 310. The program speed information includes program speeds of the plurality of memory cells of the memory cell array 310, which are listed for each page. The address decoder 321 may be set according to the loaded program speed information. In one embodiment, the address decoder 321 may be set when power is supplied to the memory system 50. If a program command and a physical block address PBA are input to the control logic 325, the address decoder 321 is configured to allow one word line or page to be selected according to program speed information by decoding the input physical block address PBA. Accordingly, the memory device 300, or more particularly, the address decoder 321, selects one page. Here, the program speed information may be information in which word lines are listed based how fast a page is set. The program speed information may be listed from a slowest word line associated with a page to a fastest word line associated with a page, where each word line associated with a page has a faster program speed.

That is, in the present disclosure, the address decoder 321 is set by reflecting program speed information. Therefore, when a program command for a plurality of pages is input, word lines respectively corresponding to the plurality of pages are not sequentially selected, but the address decoder 321 may operate such that pages of the memory cell array 110 are programmed starting with the slowest page to the fastest page, according to the program speeds of the respective pages.

The program speed information storage unit 328 may be a register or SRAM having a storage space with an arbitrary size. Thus, the program speed information is continuously stored in the program speed information storage unit 328, in one embodiment, as long as power is maintained to the memory system. In one particular example, the semiconductor memory device 100 loads the program speed information stored in the CAM area 326 into the program speed information storage unit 328. The program speed information does not require separate execution whenever a command is input. In various embodiments, the program speed information storage unit 328 may be implemented in the control logic 325.

If the control logic 325 receives a program command and a physical block address PBA, the control logic 325 may determine which pages are to be programmed for storing data. In one example, the control logic 325 selects which pages to be programmed based on the program speed information loaded from the program speed information storage unit 328. In this case, the control logic 325 may control the address decoder 321 such that pages having slow program speeds are first programmed.

Figure 5:
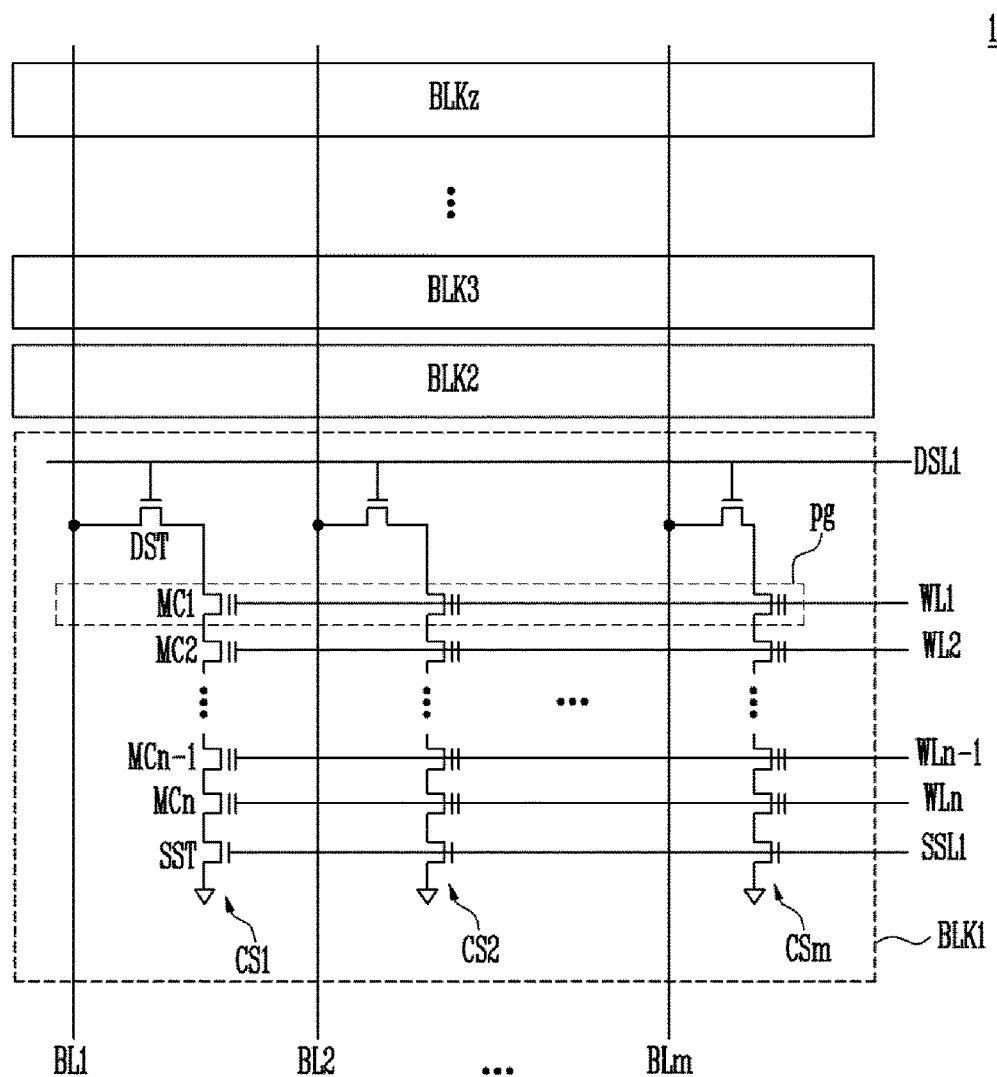
FIG. 5 is a diagram illustrating a structure of a memory cell array of FIG. 2.

FIG. 5 is a diagram illustrating a structure of the memory cell array of FIG. 2.

Referring to FIG. 5, the memory cell array 110 includes a plurality of memory blocks BLK1 to BLKz. First to zth memory blocks BLK1 to BLKz are commonly connected to first to mth bit lines BL1 to BLm. The first to mth bit lines BL1 to BLm constitute the bit lines BL of FIGS. 3 and 4. Each of the plurality of memory blocks BLK1 to BLKz constitutes an erase unit.

In FIG. 5, for convenience of description, components included in one BLK1 of the plurality of memory blocks BLK1 to BLKz are illustrated, and components included in each of the other memory blocks BLK2 to BLKz are omitted. It will be understood that each of the other memory blocks BLK2 to BLKz is configured similarly to the first memory block BLK1.

Each memory block BLK1 to BLKz, including the memory block BLK1 includes a plurality of cell strings CS1 to CSm. First to mth cell strings CS1 to CSm are connected to the first to mth bit lines BL1 to BLm, respectively.

Each of the plurality of cell strings CS1 to CSm includes a drain select transistor DST, a plurality of memory cells MC1 to MCn connected in series, and a source select transistor SST. The drain select transistor DST is connected to a drain select line DSL1. The first to nth memory cells MC1 to MCn are connected to first to nth word lines WL1 to WLn, respectively. The source select transistor SST is connected to a source select line SSL1.

A drain of the drain select transistor DST is connected to a corresponding bit line. A source of the source select transistor SST is connected to a reference voltage node. In an embodiment, the source of the source select transistor SST is connected to a common source line (not shown), and the common source line may be biased to a reference voltage.

Memory cells connected to one word line, in the first to mth cell strings CS1 to CSm, may constitute one page. Therefore, one memory block BLK1 may include a plurality of pages.

The drain select line DSL1, the first to mth word lines WL1 to WLn, and the source select line SSL1 are included in the row lines RL of FIGS. 3 and 4. The drain select line DSL1, the first to mth word lines WL1 to WLn, and the source select line SSL1 may be controlled by the address decoder 121. The first to mth bit lines BL1 to BLm may be controlled by the read/write circuit 123.

FIGS. 6A and 6B are diagrams illustrating an example of performing a program operation on memory.

In particular, referring to FIGS. 6A and 6B, the program speed information may be information of program speeds of a plurality of memory cells for each word line, i.e., for each page. Specifically, when a program operation is performed, the address decoder 121 selects one page by decoding a physical block address PBA transmitted from the control logic 125, and the address decoder 121 applies a voltage pulse generated by the voltage generator 122 to a word line corresponding to the selected page. In this case, the address decoder 121 may set word line numbers corresponding to physical block addresses PBA according to the program speed information.

FIG. 6A is an example illustrating setting a state of the address decoder 121 when the program speed information is not considered. In FIG. 6A, word line numbers (or page numbers) corresponding to physical block addresses PBA may be sequentially mapped according to the physical block addresses PBA. For example, when a program operation is performed on addresses 1 to 5 among the physical block addresses PBA, pages corresponding to word lines 1 to 5 are selected, and the program operation may be performed in an order of the word lines. For example, the program operation may program the pages associated with each word line WL1 to WLn sequentially.

FIG. 6B is an example illustrating setting a state of the address decoder 121 based on the program speed information associated with each page. In FIG. 6B, the word lines are not sequentially mapped according to the physical block addresses PBA, but may be mapped based on program speeds of memory cells connected to each word line WL1 to WLn (or each page). For example, an (N−3)th word line WLN−3, an Nth word line WLN, a ninth word line WL9, and a fifth word line WL5 have sequentially faster program speeds, respectively. That is, the word lines WL1 to WLn may be associated with first to nth physical block addresses PBA1 to PBAN based on an order in which their program speeds increase. Accordingly, the first physical block address PBA1 includes the word line with the slowest programming speed. The second physical block address PBA2 includes a word line with a programming speed faster than first physical block address PBA1. The third physical block address PBA3 includes a word line with a programming speed faster than the second physical block address PBA2. This increase in the speed of the word lines continues.

Here, it is assumed that a program command for addresses 1 to 4 among the physical block addresses PBA is input. In this case, the address decoder 121 having the program speed information reflected thereto is set as shown in FIG. 6B, and therefore, a program order may be determined in an order of the (N−3)th word line, the Nth word line, the ninth word line, and the fifth word line. Thus, according to the present disclosure, the program order can be determined differently from the conventional program order in which a program operation is performed in an order of the word lines.

Figure 7:
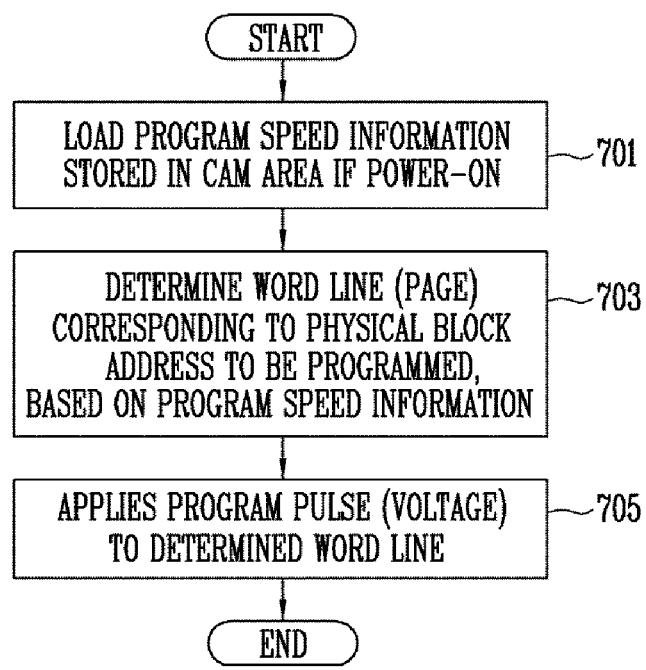
FIG. 7 is flowchart illustrating an operating method of the memory system according to the present disclosure.

FIG. 7 is flowchart illustrating an operating method of the memory system according to the present disclosure.

Referring to FIG. 7, if power is supplied to the memory system (power-on), the memory system loads program speed information stored in the CAM area 120 (701). When the power is supplied to the memory system, the memory system performs a reset operation for the purpose of initialization. When the reset operation is first performed, an auto CAM read operation is performed. In this case, setting information stored in the CAM area 126, including program speed information, (claim 13) is loaded into an internal RAM included in the semiconductor memory device 100, to be used in an operation of the semiconductor memory device 100. The program speed information stored in the CAM area 126 may include program speeds of the plurality of memory cells included in the memory cell array listed for each page. Specifically, the program speed information may be information in which physical block addresses PBA are respectively mapped to a plurality of pages in an order from pages (or word lines) having slow program speeds to pages having fast program speeds, with each successive intervening page having an increasing programming speed.

In step 703, when a program operation is performed, the memory system may determine a word line (or page) corresponding to a physical block address PBA to be programmed, based on the program speed information. Here, the physical block address PBA may be a physical block address PBA received from the controller. Specifically, if the program speed information is loaded, the address decoder 121 is set according to the program speed information, and may select a word line (or page) according to each of the physical block addresses PBA, based on a set mapping relationship.

In step 705, the memory system may perform a program operation on the selected page. Thus, according to the present disclosure, the memory system performs a program operation on a page having the slowest program speed, differently from the conventional program order in which a program operation is performed.

Figure 8:
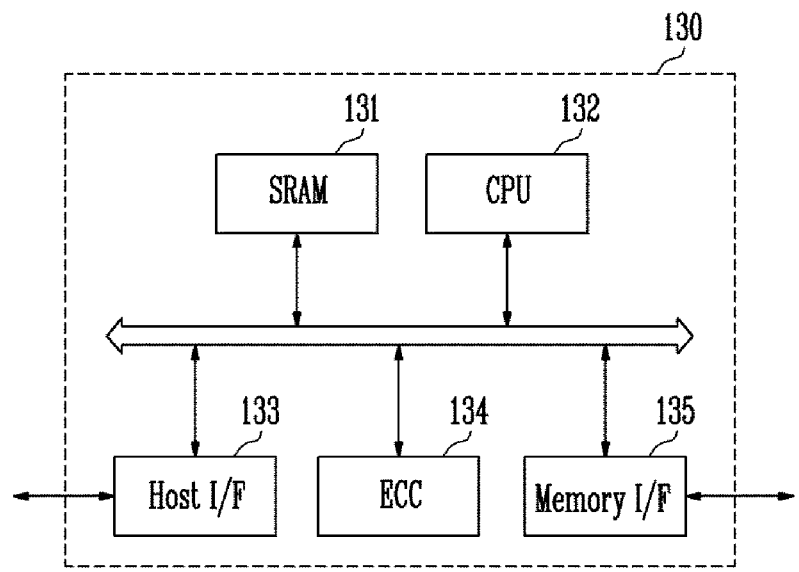
FIG. 8 is a block diagram illustrating an embodiment of a controller of the memory system.

FIG. 8 is a block diagram illustrating an embodiment of the controller of the memory system.

The memory system 50 shown in FIG. 2 may be provided a memory card or a solid state disk (SSD) through a combination of the semiconductor memory device 100 and the controller 200.

Referring to FIG. 8, the controller 130 may include an SRAM 131, a central processing unit or processing unit 132, a host interface unit 133, an error correction block (ECC) 134, and a memory interface 135. Among the components of FIG. 8, the processing unit 132 and the SRAM 131 may operate as the memory controller 220 of FIG. 2, and the ECC 134 may correspond to the ECC 230 of the controller 200 of FIG. 2. The SRAM 131 is used as an operation memory of the processing unit 132. In various embodiments, the SRAM 131 may be included in the memory controller 220 of FIG. 2 or implemented as a separate RAM.

The host interface unit 133 includes a data exchange protocol for communication a host connected with the memory system 50. The ECC 134 detects and corrects errors included in data read from the semiconductor memory device 100. The memory interface 135 interfaces with the semiconductor memory device 100 of the present disclosure. The processing unit 132 performs overall operations for data exchange for the controller 130.

Although not shown in this figure, the memory system 50 according to the present disclosure may be further provided with a ROM (not shown) for storing code data for interfacing with a host. The semiconductor memory device 100 may be provided as a multi-chip package formed of a plurality of flash memory chips. The memory system 50 of the present disclosure may be provided as a storage medium with high reliability and low error rate. Particularly, the semiconductor memory device 100 of the present disclosure may be provided in a memory system such as a solid state disk (hereinafter, referred to as SDD) which has been actively studied in recent years. In this case, the controller 130 may be configured to communicate with the outside (e.g., the host) through one among various interface protocols, such as embedded Multi-Media Card (eMMC), Universal Flash Storage (UFS), Universal Serial Bus (USB), MMC, Peripheral Component Interconnect Express (PCI-E), Serial Advanced Technology Attachment (SATA), Parallel Advanced Technology Attachment (PATA), Small Computer System Interface (SCSI), Enhanced Small Device Interface (ESDI), and Integrated Development Environment (IDE).

Figure 9:
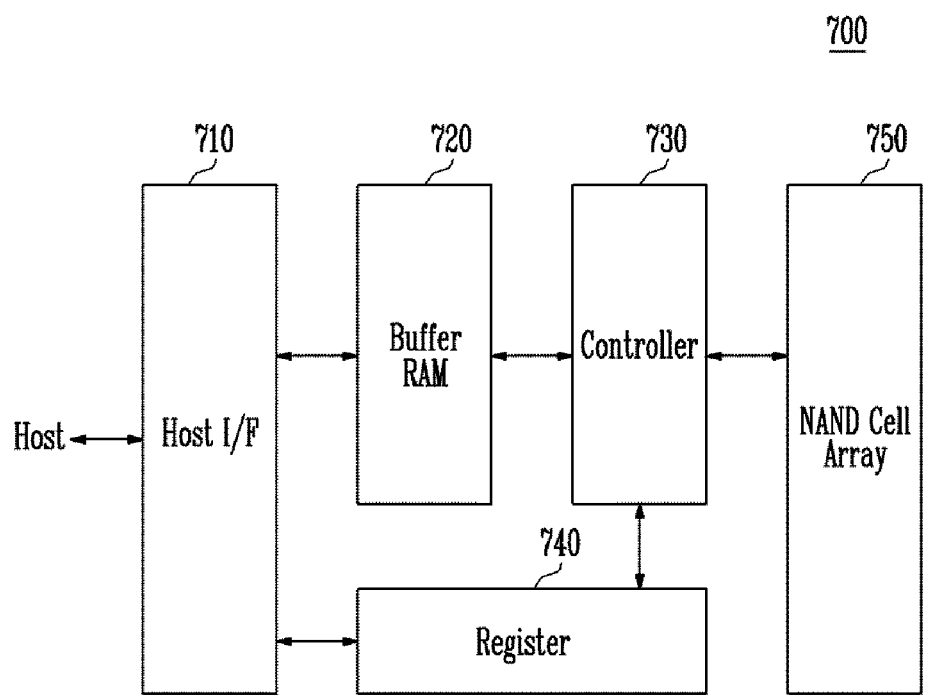
FIG. 9 is a diagram illustrating still another embodiment of the memory system according to the present disclosure.

FIG. 9 is a diagram illustrating a fusion or flash memory device as an implementation example of the memory system according to the present disclosure. For example, technical features of the present disclosure may be applied to the flash memory device 700 of FIG. 9.

The flash memory device 700 includes a host interface unit 710 for exchanging various information with devices using different protocols, a buffer RAM 720 for embedding code to drive the memory device or temporarily storing data, a controller 730 for controlling reading, programming and every state in response to a control signal and a command inputted from an outside device, a register 740 for storing data such as configuration data for defining a command, an address, a system operation environment in the memory device, and a NAND flash cell array 750 having an operation circuit including a non-volatile memory cell and a page buffer. The flash memory device 700 programs data according to the above-described method, in response to a write request from the host.

In FIG. 9, the NAND flash cell array 750 may correspond to the memory cell array 110 of FIG. 2. Also, the peripheral circuit 120, the memory controller 220, the RAM 210, and the ECC 230 of FIG. 2 may be included in the controller 730 of FIG. 9.

Figure 10:
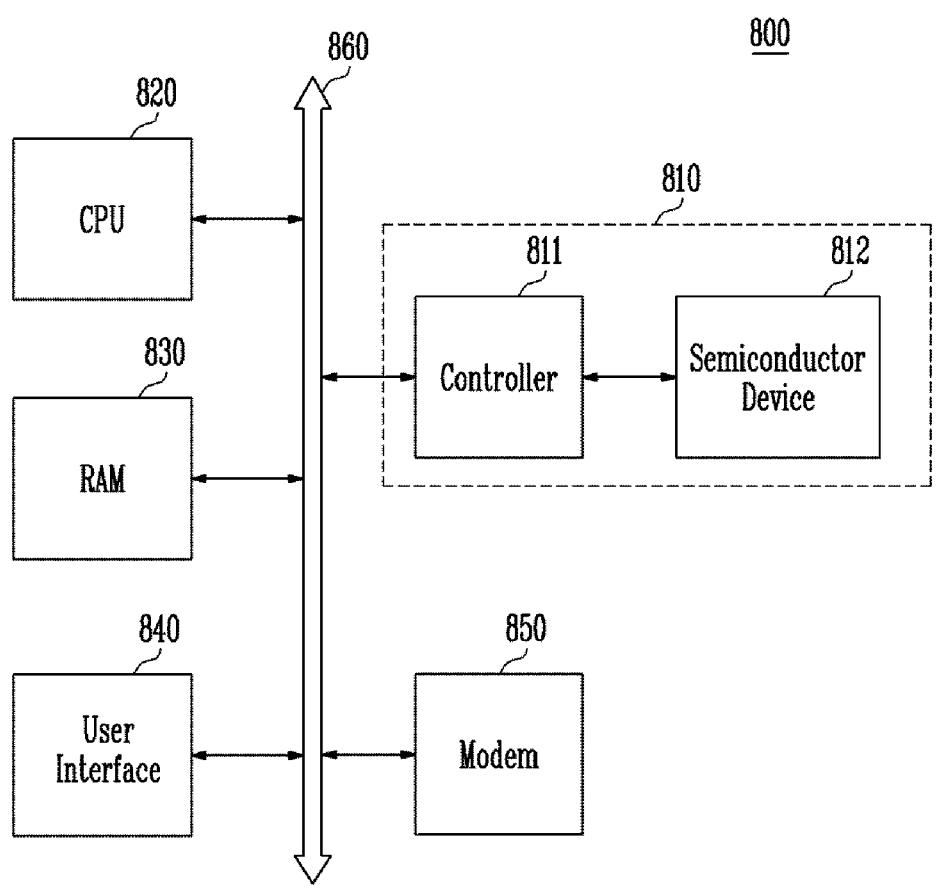
FIG. 10 is a diagram illustrating a computing system including the memory system according to the present disclosure.

FIG. 10 is a diagram illustrating a computing system including the memory system according to the present disclosure.

Referring to FIG. 10, the computing system 800 according to the present disclosure includes a central processing unit or microprocessor 820, a RAM 830, a user interface 840, a modem 850 such as a baseband chipset, and a memory system 810 connected to a system bus 860. Here, a controller 811 and a semiconductor device 812 in the memory system 810 may correspond to the controller and the semiconductor memory device according to embodiments of the present disclosure. When the computing system 800 according to the present disclosure is a mobile device, a battery (not shown) for supplying an operation voltage of the computing system 800 may be further provided. Although not shown in this figure, it will be obvious to those skilled in the art that the computing system 800 according to the present disclosure may further include an application chipset, a camera image processor (CIS), a mobile DRAM, etc. The memory system 810 may include a solid state drive/disk (SSD) using, for example, a non-volatile memory for storing data. Alternatively, the memory system 810 may be provided as a fusion flash memory.

According to the present disclosure, it is possible to include a memory system having improved reliability and operating method thereof.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a semiconductor memory device configured to include a memory cell array having a plurality of pages; and
a controller configured to sequentially transmit, to the semiconductor memory device, physical block address of page to be programmed among the plurality of pages,
wherein the semiconductor memory device selects a word line corresponding to the physical block addresses among the plurality of pages according to previously stored program speed information, and performs a program operation on the selected word line,
wherein each of the plurality of pages includes slow cells and fast cells,
wherein the program speed information is a list of the plurality of pages in a descending order of a ratio of the slow cells included in each page, and wherein the selected word line has a highest rate of the slow cells.

2. The memory system of claim 1, wherein the program speed information is stored in a CAM area among the plurality of pages.

3. The memory system of claim 2, wherein the semiconductor memory device further includes a program speed information storage unit configured to store the program speed information.

4. The memory system of claim 3, wherein, if power is supplied to the memory system, the semiconductor memory device loads the program speed information stored in the CAM area into the program speed information storage unit.

5. The memory system of claim 1, wherein the program speed information includes information in which the physical block addresses are mapped to the plurality of pages according to program speeds.

6. The memory system of claim 1, wherein the semiconductor memory device further includes an address decoder configured to select any one page among the plurality of pages by decoding the physical block address.

7. The memory system of claim 6, wherein if power is supplied to the memory system, the semiconductor memory device sets the address decoder by using the program speed information.

8. The memory system of claim 1, wherein the controller further includes a host interface unit configured to communicate with a host connected to the memory system.

9. The memory system of claim 8, wherein the controller further includes a read only memory (ROM) configured to store code data for interfacing with the host.

10. A method of operating a semiconductor memory device including a memory cell array having a plurality of pages, wherein each of the plurality of pages includes slow cells and fast cells, the method comprising:
loading program speed information stored in a CAM area of the memory cell array if power is supplied to the memory system,
wherein the program speed information is a list of the plurality of pages in a descending order of a ratio of the slow cells included in each page;
determining a page having a highest ratio of the slow cells among the plurality of pages according to the program speed information; and
performing a program operation on the determined page.

11. The method of claim 10, wherein the program speed information includes information in which the physical block addresses are sequentially mapped to the plurality of pages from a page having the slowest program speed.

12. The method of claim 10, wherein in the loading of the program speed information stored in the CAM area of the memory cell array, an address decoder for selecting any one page among the plurality of pages by decoding the physical block address is set according to the program speed information.

13. The method of claim 10, wherein the loading of the program speed information stored in the CAM area of the memory cell array is performed in an auto CAM read operation during a reset operation of the memory system.

14. The method of claim 10, wherein the determining the page having a slowest program speed comprises:
determining a program order of the plurality of pages, based on the program speed information; and
selecting the page having a slowest program speed among the plurality of pages according to the program order.

15. The method of claim 14, wherein the program speed information includes program speeds of a plurality of memory cells associated with a page included in the memory cell array.

16. The method of claim 14, wherein the program speed information includes a listing of word lines associated with a slowest page to a fastest page.

17. The method of claim 14, wherein a control logic selects which pages are to be programmed based on the program speed information, wherein the program speed information is loaded from a program speed information storage unit.

18. The method of claim 14, wherein the program order of the plurality of pages is from slowest to fastest page.

19. The method of claim 18, wherein a semiconductor memory device selects a page to perform a program operation on according to previously stored program speed information, where a slowest page is selected and each page selected after a first page has a faster programming speed.

20. The method of claim 14, wherein program speed information is stored in a CAM area of the memory cell array.

* * * * *